US010867770B2

(12) United States Patent
Hempenius et al.

(10) Patent No.: US 10,867,770 B2
(45) Date of Patent: Dec. 15, 2020

(54) E-BEAM APPARATUS

(71) Applicant: ASML Netherlands B.V., AH Veldhoven (NL)

(72) Inventors: Peter Paul Hempenius, Nuenen (NL); Sven Antoin Johan Hol, San Jose, CA (US); Maarten Frans Janus Kremers, Eindhoven (NL); Henricus Martinus Johannes Van De Groes, Tiel (NL); Niels Johannes Maria Bosch, Venlo (NL); Marcel Koenraad Marie Baggen, Nuenen (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/402,158

(22) Filed: May 2, 2019

(65) Prior Publication Data

US 2019/0341224 A1 Nov. 7, 2019

(30) Foreign Application Priority Data

May 2, 2018 (EP) .................................... 18170351

(51) Int. Cl.
*H01J 37/20* (2006.01)
*H01J 37/09* (2006.01)
*H01J 37/317* (2006.01)

(52) U.S. Cl.
CPC .............. *H01J 37/20* (2013.01); *H01J 37/09* (2013.01); *H01J 37/3175* (2013.01);
(Continued)

(58) Field of Classification Search
CPC ........ H01J 37/20; H01J 37/09; H01J 37/3175; H01J 2237/0264; H01J 2237/20221; H01J 2237/20285
(Continued)

(56) References Cited

U.S. PATENT DOCUMENTS 6,437,864 B1 8/2002 Watanabe et al.
6,730,916 B1 5/2004 Tsuji et al.
(Continued)

FOREIGN PATENT DOCUMENTS

JP 1125932 A2 5/1989
TW 201643561 A 12/2016

OTHER PUBLICATIONS

Office Action issued by the ROC (Taiwan) Patent Office in related Patent Application No. 108114996, dated May 27, 2020 (11 pgs.).

*Primary Examiner* — Nicole M Ippolito
(74) *Attorney, Agent, or Firm* — Finnegan, Henderson, Farabow, Garrett & Dunner, LLP

(57) ABSTRACT

An e-beam apparatus is disclosed, the tool comprising an electron optics system configured to project an e-beam onto an object, an object table to hold the object, and a positioning device configured to move the object table relative to the electron optics system. The positioning device comprises a short stroke stage configured to move the object table relative to the electron optics system and a long stroke stage configured to move the short stroke stage relative to the electron optics system. The e-beam apparatus further comprises a magnetic shield to shield the electron optics system from a magnetic disturbance generated by the positioning device. The magnetic shield may be arranged between the positioning device and the electron optics system.

20 Claims, 8 Drawing Sheets

(52) U.S. Cl.
CPC .................. *H01J 2237/0264* (2013.01); *H01J 2237/20221* (2013.01); *H01J 2237/20285* (2013.01)

(58) Field of Classification Search
USPC ...... 250/440.11, 441.11, 442.11, 443.1, 306, 250/307, 309, 310, 311, 492.1, 492.2, 250/492.21, 492.22, 492.23, 492.3
See application file for complete search history.

(56) References Cited

U.S. PATENT DOCUMENTS

| | | | | |
|---|---|---|---|---|
| 7,365,456 | B2 | 4/2008 | Uchida | |
| 8,952,342 | B2 | 2/2015 | Peijster et al. | |
| 2002/0047321 | A1 | 4/2002 | Yamada | |
| 2002/0079461 | A1 | 6/2002 | Kirschstein et al. | |
| 2003/0155820 | A1 | 8/2003 | Tominaga et al. | |
| 2004/0012765 | A1 | 1/2004 | Akutsu et al. | |
| 2011/0147612 | A1 | 6/2011 | Peuster et al. | |
| 2013/0011797 | A1 | 1/2013 | Ishikawa et al. | |
| 2013/0070223 | A1 | 3/2013 | Peijster et al. | |
| 2013/0342827 | A1* | 12/2013 | Ummethala ........ | G03F 7/70716 356/72 |
| 2014/0306123 | A1 | 10/2014 | Ishikawa et al. | |
| 2015/0034842 | A1 | 2/2015 | Uchida | |
| 2015/0364292 | A1 | 12/2015 | Ishikawa et al. | |

* cited by examiner

E-BEAM APPARATUS

CROSS REFERENCE TO RELATED APPLICATIONS

This application claims priority to EP Application No. 18170351.3, which was filed on May 2, 2018 and is incorporated by reference in its entirety.

FIELD

The embodiments of the present disclosure relate to an e-beam apparatus.

BACKGROUND ART

The embodiments of the present disclosure relate to an e-beam apparatus as can be applied to inspect semiconductor devices.

The e-beam apparatus projects an e-beam, such as an electron beam, on a surface of a substrate. A magnetic lens, a device for focusing or deflecting an electron beam by a magnetic force, focuses the e-beam onto a target portion of the substrate by means of a magnetic field. As the e-beam may comprise electrically charged particles (e.g. electrons) and as the magnetic field interacts with the charged particles by a magnetic Lorentz force, the e-beam may be susceptible to magnetic disturbances.

The actuators of the positioning device of the e-beam apparatus may be magnetic actuators. Such magnetic actuators, upon actuation, generate magnetic stray fields that may affect the e-beam. On the one hand, the magnetic stray fields may interact with the e-beam respectively the magnetic lens operation, hence result in an inaccuracy of the e-beam. On the other hand, a loss in throughput may result, in case the e-beam inspection tool would interrupt when the positioning device is actuated, and resumes inspection thereafter, i.e. resumes inspection when the actuators of the positioning device exert low or no forces, to reduce an effect of the magnetic stray fields.

SUMMARY

It is an object of the present disclosure to provide an e-beam inspection tool that enables a high accuracy at a high throughput.

According to an aspect of the present disclosure, there is provided an e-beam apparatus comprising:

an electron optics system configured to project an e-beam onto an object, an object table to hold the object, a positioning device configured to move the object table relative to the electron optics system, the positioning device comprising a short stroke stage configured to move the object table relative to the electron optics system and a long stroke stage configured to move the short stroke stage relative to the electron optics system, wherein the e-beam apparatus further comprises a magnetic shield to shield the electron optics system from a magnetic disturbance generated by the positioning device.

According to an aspect of the present disclosure, there is provided an e-beam apparatus according to any of the preceding aspects, wherein the e-beam apparatus is a scanning electron microscope, an electron beam direct writer, an electron beam projection lithography apparatus, an electron beam inspection apparatus, an electron beam defect verification apparatus, or an electron beam metrology apparatus.

BRIEF DESCRIPTION OF THE DRAWINGS

The embodiments of the present disclosure will be readily understood by the following detailed description in conjunction with the accompanying drawings, wherein like reference numerals designate like structural elements.

Figure 1A:
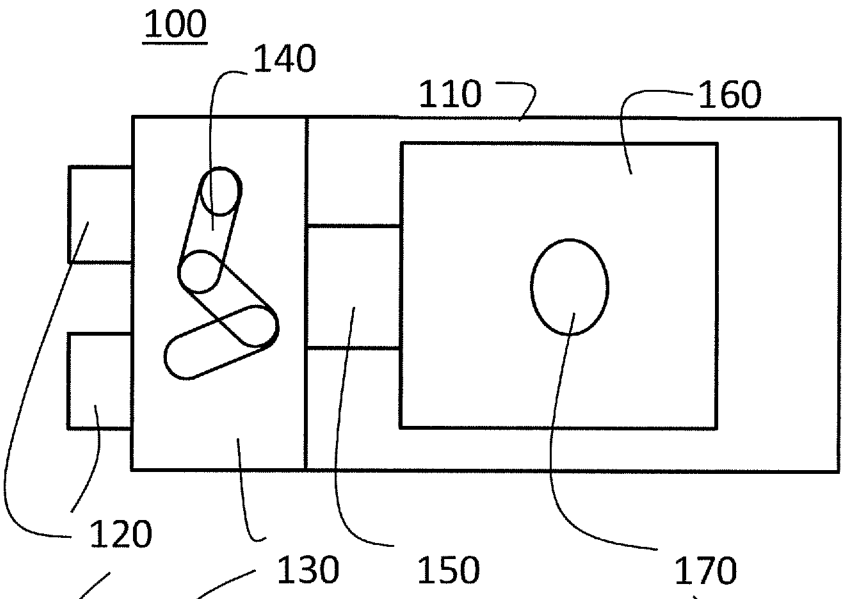
FIGS. 1A and 1B are schematic illustrations of an exemplary e-beam apparatus, such as an e-beam inspection tool, according to embodiments of the present disclosure.

While the disclosed embodiments are susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the disclosed embodiments as defined by the appended claims.

DETAILED DESCRIPTION OF EXAMPLE EMBODIMENTS

Various example embodiments of the present disclosure will now be described more fully with reference to the accompanying drawings in which some example embodiments of the present disclosure are shown. In the drawings, the thicknesses of layers and regions may be exaggerated for clarity.

Detailed illustrative embodiments of the present disclosure are disclosed herein. However, specific structural and functional details disclosed herein are merely representative for purposes of describing example embodiments of the present disclosure. This disclosed embodiments may, however, be embodied in many alternate forms and should not be construed as limited to only the embodiments set forth herein.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure. Like numbers refer to like elements throughout the description of the figures.

As used herein, the term "specimen" generally refers to a wafer or any other specimen on which defects of interest (DOI) may be located. Although the terms "specimen" and "sample" are used interchangeably herein, it is to be understood that embodiments described herein with respect to a wafer may be configured or used for any other specimen (e.g., a reticle, mask, or photomask).

As used herein, the term "wafer" generally refers to substrates formed of a semiconductor or non-semiconductor material. Examples of such a semiconductor or non-semiconductor material include, but are not limited to, monocrystalline silicon, gallium arsenide, and indium phosphide. Such substrates may be commonly found or processed in semiconductor fabrication facilities.

In this present disclosure, "axial" means "in the optical axis direction of an apparatus, column or a device such as a lens", while "radial" means "in a direction perpendicular to the optical axis". Usually, the optical axis starts from the cathode and ends at specimen. The optical axis always refers to z-axis in all drawings.

The term, crossover, refers to a point where the electron beam is focused.

The term, virtual source, means the electron beam emitted from the cathode can be traced back to a "virtual" source.

The apparatus (e.g. inspection tool) according to the present disclosure relates to a charged particle source, especially to an e-beam source which can be applied to a SEM, an e-beam inspection tool, or an EBDW. The e-beam source, in this art, may also be referred to as an e-gun (Electron Gun).

With respect to the drawings, it is noted that the figures are not drawn to scale. In particular, the scale of some of the elements of the figures may be greatly exaggerated to emphasize characteristics of the elements. It is also noted that the figures are not drawn to the same scale. Elements shown in more than one figure that may be similarly configured have been indicated using the same reference numerals.

In the drawings, relative dimensions of each component and among every component may be exaggerated for clarity. Within the following description of the drawings the same or like reference numbers refer to the same or like components or entities, and only the differences with respect to the individual embodiments are described.

Accordingly, while example embodiments of the present disclosure are capable of various modifications and alternative forms, embodiments thereof are shown by way of example in the drawings and will herein be described in detail. It should be understood, however, that there is no intent to limit example embodiments of the present disclosure to the particular forms disclosed, but on the contrary, example embodiments of the present disclosure are to cover all modifications, equivalents, and alternatives falling within the scope of the present disclosure.

Figure 1B:
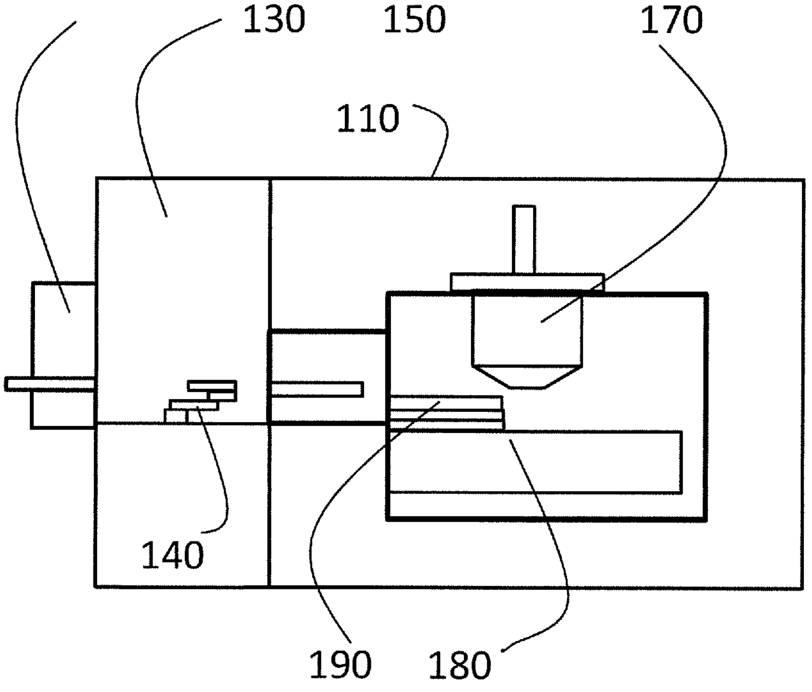

FIGS. 1A and 1B schematically depict a top view and a cross-sectional view of an electron beam (e-beam) inspection (EBI) system 100 according to embodiments of the present disclosure. The embodiment as shown comprises an enclosure 110, a pair of load ports 120 serving as an interface to receive objects to be examined and to output objects that have been examined. The embodiment as shown further comprises an object transfer system, referred as an EFEM, equipment front end module 130, that is configured to handle or transport the objects to and from the load ports. In the embodiment as shown, the EFEM 130 comprises a handler robot 140 configured to transport objects between the load ports and a load lock 150 of the EBI system 100. The load lock 150 is an interface between atmospheric conditions occurring outside the enclosure 110 and in the EFEM and the vacuum conditions occurring in a vacuum chamber 160 of the EBI system 100. In the embodiment as shown, the vacuum chamber 160 comprises an electron optics system 170 configured to project an e-beam onto an object to be inspected, e.g. a semiconductor substrate or wafer. The EBI system 100 further comprises a positioning device 180 that is configured to displace the object 190 relative to the e-beam generated by the electron optics system 170.

In some embodiments, the positioning device may comprise a cascaded arrangement of multiple positioners such an XY-stage for positioning the object in a substantially horizontal plane, and a Z-stage for positioning the object in the vertical direction.

In some embodiments, the positioning device may comprise a combination of a coarse positioner, configured to provide a coarse positioning of the object over comparatively large distances and a fine positioner, configured to provide a fine positioning of the object over comparatively small distances. Where is the present document, the term positioner is applied, this may for example be understood as a stage.

In some embodiments, the positioning device 180 further comprises an object table for holding the object during the inspection process performed by the EBI system 100. In such embodiment, the object 190 may be clamped onto the object table by means of a clamp such as an electrostatic clamp. Such a clamp may be integrated in the object table.

In accordance with the present disclosure, the positioning device 180 comprises a first positioner for positioning the object table and a second positioner for positioning the first positioner and the object table. In addition, the positioning device 180 as applied in the e-beam inspection tool 100 according to the present disclosure comprises a heating device that is configured to generate a heat load in the object table.

The positioning device 180 and heating device as applied in the present disclosure will be discussed in more detail below.

Figure 2:
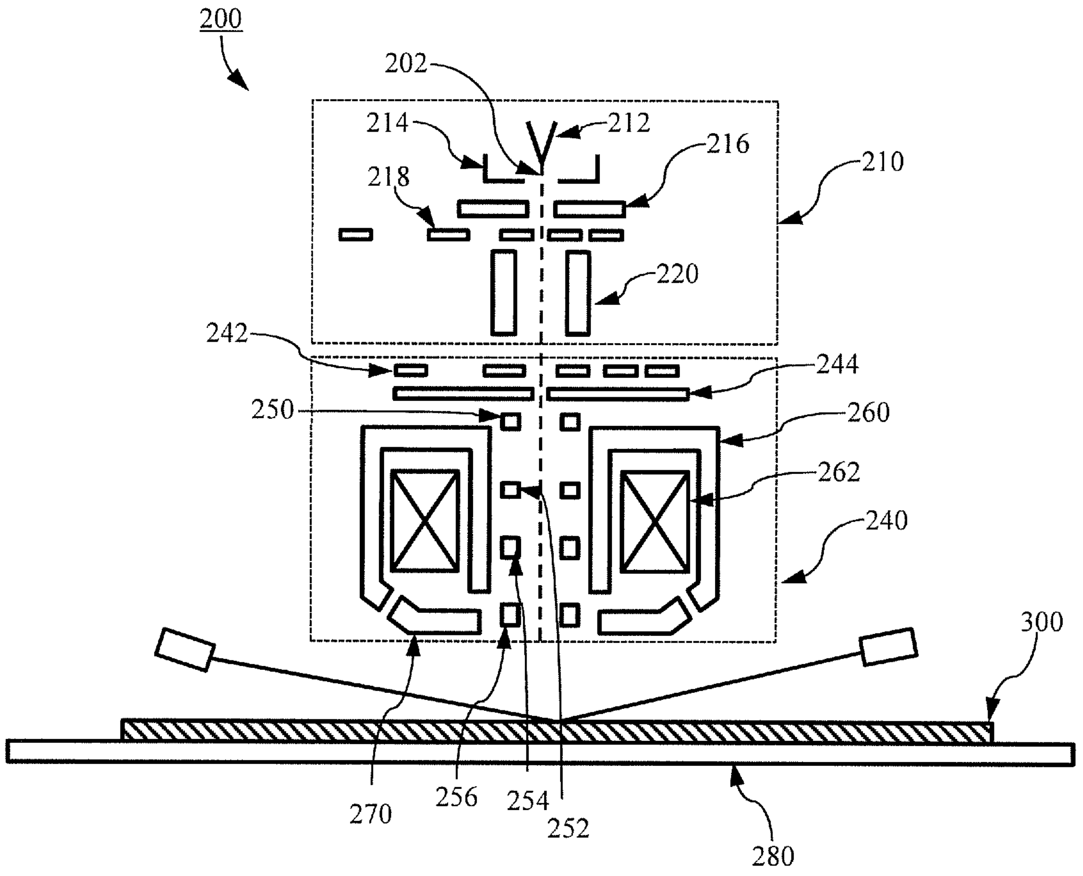
FIGS. 2 and 3 are schematic illustrations an exemplary electron optical system as can be applied in embodiments of the present disclosure.

FIG. 2 schematically depict an exemplary electron optics system 200 as can be applied in e-beam inspection tool or system according to the present disclosure. The electron optics system 200 comprises an e-beam source, referred to as the electron gun 210 and an imaging system 240.

The electron gun 210 comprises an electron source 212, suppressor 214, an anode 216, a set of apertures 218, and a condenser 220. The electron source 212 can be a Schottky emitter. More specifically, the electron source 212 includes a ceramic substrate, two electrodes, a tungsten filament, and a tungsten pin. The two electrodes are fixed in parallel to the ceramic substrate, and the other sides of the two electrodes are respectively connected to two ends of the tungsten filament. The tungsten is slightly bended to form a tip for placing the tungsten pin. Next, a $ZrO2$ is coated on the surface of the tungsten pin and is heated to 1300° C. so as to be melted and cover the tungsten pin but uncover the pinpoint of the tungsten pin. The melted $ZrO2$ can make the work function of the tungsten lowered and decrease the energy barrier of the emitted electron, and thus the electron beam 202 is emitted efficiently. Then, by applying negative electricity to the suppressor 214, the electron beam 202 is suppressed. Accordingly, the electron beam having the large spread angle is suppressed to the primary electron beam 202, and thus the brightness of the electron beam 202 is enhanced. By the positive charge of the anode 216, the electron beam 202 can be extracted, and then the Coulomb's compulsive force of the electron beam 202 may be controlled by using the tunable aperture 218 which has different aperture sizes for eliminating the unnecessary electron beam outside of the aperture. In order to condense the electron beam 202, the condenser 220 is applied to the electron beam 202, which also provides magnification. The condenser 220 shown in the FIG. 2 may e.g. be an electrostatic lens which can condense the electron beam 202. On the other hand, the condenser 220 can be also a magnetic lens.

Figure 3:
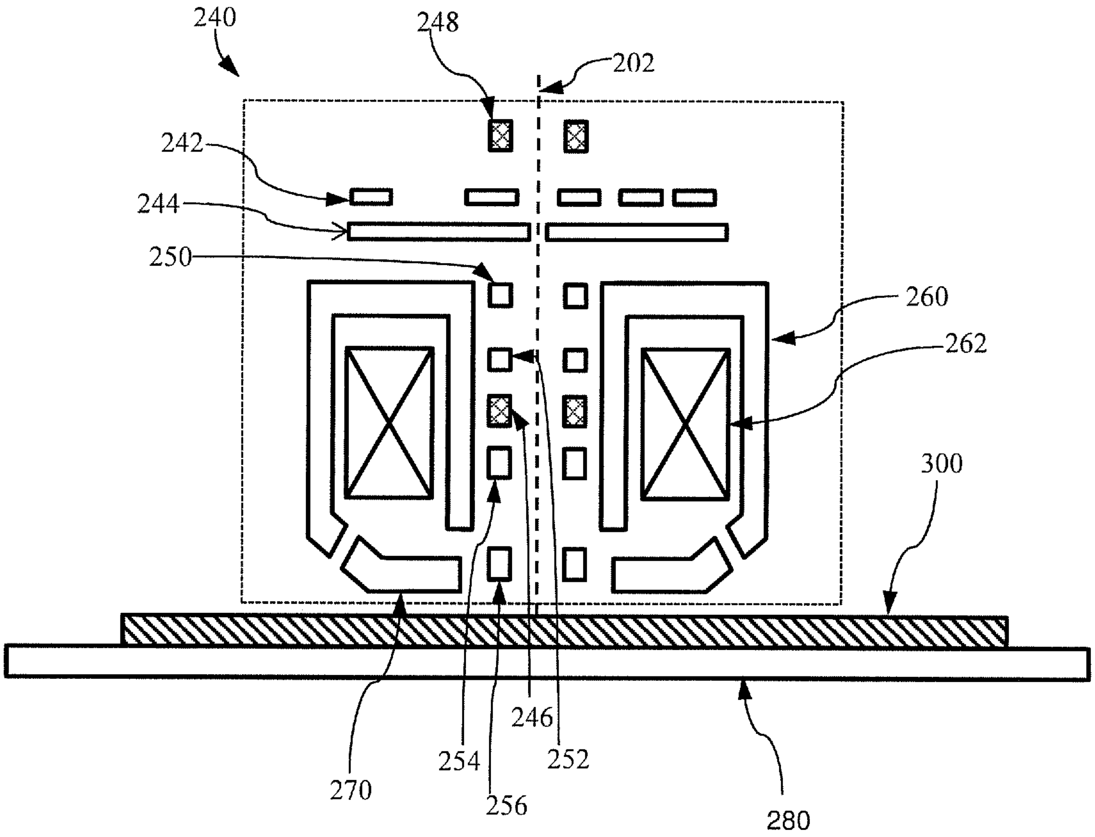

The imaging system 240 as shown in FIG. 3 comprises a blanker 248, a set of apertures 242, a detector 244, four sets of deflectors 250, 252, 254, and 256, a pair of coils 262, a yoke 260, a filter 246, and an electrode 270. The electrode 270 is used to retard and deflect the electron beam 202, and further has electrostatic lens function due to the combination of upper pole piece and sample 300. Besides, the coil 262 and the yoke 260 are configured to the magnetic objective lens.

The electron beam 202, described above, is generated by heating the electron pin and applying the electric field to anode 216, so that, in order to stabilize the electron beam 202, there must be a long time for heating the electron pin. For a user end, it is surely time consuming and inconvenient. Hence, the blanker 248 is applied to the condensed electron beam 202 for temporally deflecting the electron beam 202 away from the sample rather than turning off it.

The deflectors 250 and 256 are applied to scan the electron beam 202 to a large field of view, and the deflectors 252 and 254 are used for scanning the electron beam 202 to a small field of view. All the deflectors 250, 252, 254, and 256 can control the scanning direction of the electron beam 202. The deflectors 250, 252, 254, and 256 can be electrostatic deflectors or magnetic deflectors. The opening of the yoke 260 is faced to the sample 300, which immerses the magnetic field into the sample 300. On the other hand, the electrode 270 is placed beneath the opening of the yoke 260, and therefore the sample 300 will not be damaged. In order to correct the chromatic aberration of the electron beam 202, the retarder 270, the sample 300, and the upper pole piece form a lens to eliminate the chromatic aberration of the electron beam 202.

Besides, when the electron beam 202 bombards into the sample 300, a secondary electron will be emanated from the surface of the sample 300. Next the secondary electron is directed to the detector 244 by the filter 246.

Figure 4:
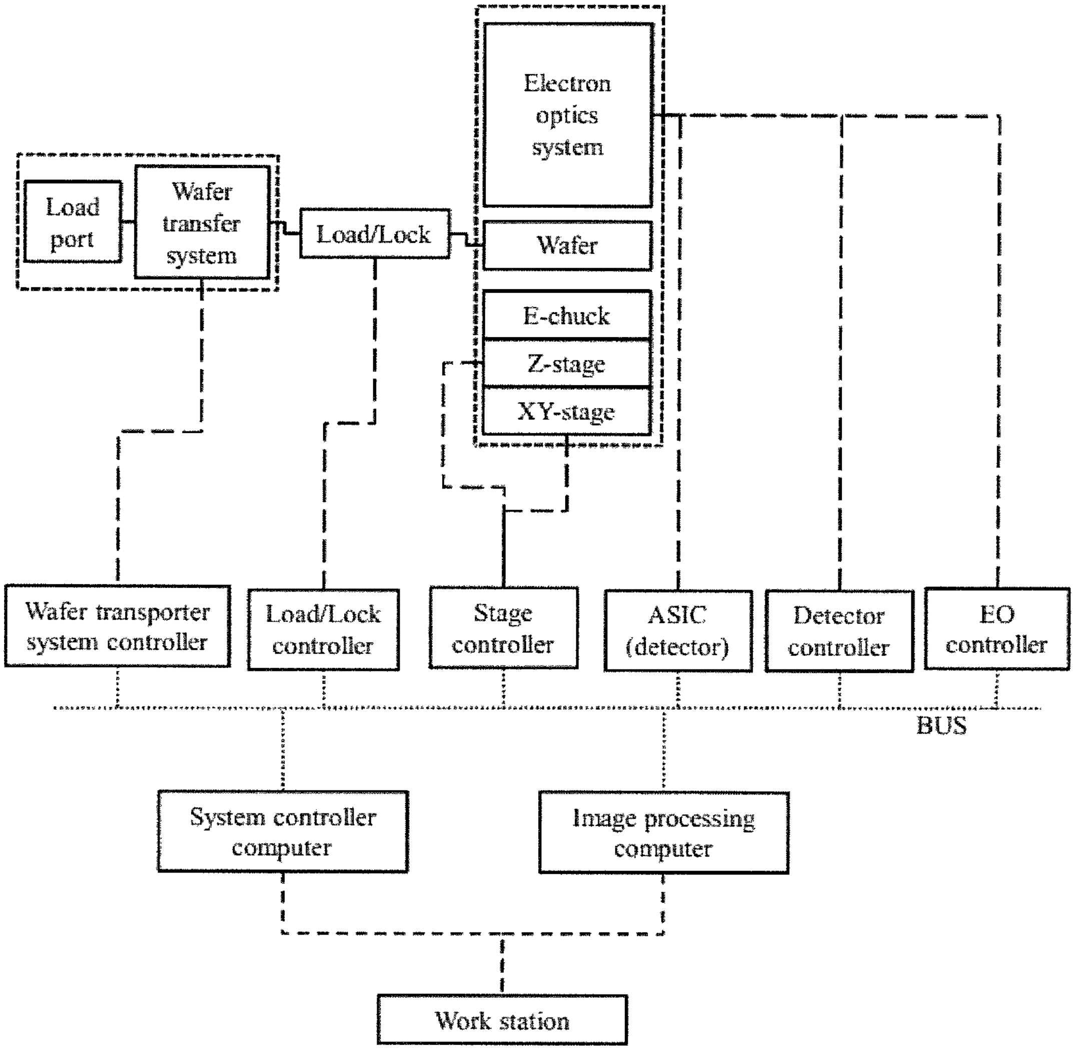
FIG. 4 schematically depicts an exemplary control architecture of an EBI system according to the present disclosure.

FIG. 4 schematically depicts a possible control architecture of an EBI system according to the present disclosure. As indicated in FIG. 1, the EBI system comprises a load lock, a wafer transfer system, a load/lock, an electron optics system and a positioning device, e.g. including a z-stage and a x-y stage. As illustrated, these various components of the EBI system may be equipped with respective controllers, e.g., a wafer transporter system controller connected to the wafer transfer system, a load/lock controller, an electron optics controller, a detector controller, a stage controller. These controllers may for example be communicatively connected to a system controller computer and an image processing computer, e.g., via a communication bus. In the embodiment as shown, the system controller computer and the image processing computer may be connected to a workstation.

The load port loads a wafer to the wafer transfer system, such as EREM 130, and the wafer transfer system controller controls the wafer transfer to transfer the wafer to the load/lock, such as load lock 150. The load/lock controller controls the load/lock to the chamber, such that an object that is to be examiner, e.g. a wafer can be fixed on a clamp, e.g. an electrostatic clamp, also referred to as an e-chuck. The positioning device, e.g. the z-stage and the xy-stage, enable the wafer to move by the stage controller. In some embodiments, a height of the z-stage may e.g. be adjusted using a piezo component such as a piezo actuator. The electron optic controller may control all the conditions of the electron optics system, and the detector controller may receive and convert the electric signals from the electron optic system to image signals. The system controller computer is to send the commands to the corresponding controller. After receiving the image signals, the image processing computer may process the image signals to identify defects.

Figure 5:
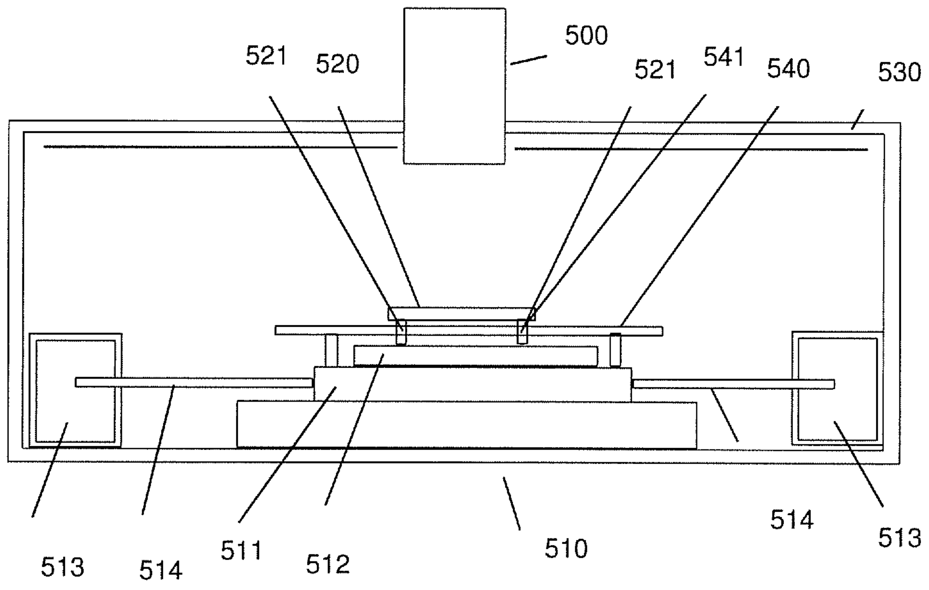
FIG. 5 schematically depicts an exemplary e-beam apparatus according to embodiments of the present disclosure.

FIG. 5 schematically depicts an exemplary e-beam apparatus. The e-beam apparatus projects a beam of particles, such as electrically charged particles, such as electrons or other particles, onto an object. The e-beam apparatus may be an e-beam inspection tool. The e-beam apparatus comprising in the present example an electron optics system 500, a positioning device 510 and an object table 520. The positioning device 510 and the object table 520 are arranged in a vacuum chamber 530. The electron optics system 500 may be provided in the vacuum chamber or connected thereto. More specifically, the electron beam of the electron optics system 500 propagates in the vacuum chamber 530, more specifically the e-beam propagates along a propagation path onto a target surface of the object to be inspected. The positioning device 510 moves the object table 520 relative to the electron optics system 500. For example, the positioning device 510 may move the object table 520. Alternatively, the positioning device 510 may move the electron optics system 500.

The positioning device 510 comprises a long stroke stage 511 and a short stroke stage 512. The short stroke stage 512 is connected to the object table 520 to move the object table 520. The long stroke stage 511 is connected to the short stroke stage 512 so as to move the short stroke stage 512 and the object table 520. The long stroke stage 511 provides for a coarse positioning of the object table 520 white the short stroke stage 512 provides for a fine positioning of the object table 520. The long and short stroke stages 511, 512 may comprise motors each comprising a coil and a magnet, such as a permanent magnet or an electromagnet. When the electric current is running through a coil of the long stroke stage 511 or the short stroke stage 512, the propagation path of the e-beam is subjected to a magnetic stray field.

As explained above, the magnetic stray fields may result in a loss of accuracy or a loss of throughput of the e-beam inspection tool. Conventional solutions to this problem comprise a magnetic shielding of the magnets and coils of the actuators of the positioning device. This shielding provides for a reduction of magnetic stray fields towards the propagation path and towards the magnetic lens. However, these conventional solutions have shown to be insufficient. Although the magnetic stray field is reduced, the electron optics system is still subjected to disturbances as a result of moving magnetic parts.

According to an aspect of the present disclosure, a magnetic shield 540 is arranged between the positioning device 510 and the electron optics system 500. The magnetic shield 540 provides for a shielding of the electron optics system 500 from magnetic disturbances by the positioning device 510, e.g. magnetic stray fields from magnetic actuators for the long stroke stage 511 or the short stroke stage 512.

Shielding the magnetic stray fields from the magnetic actuators is beneficial as the magnetic stray field is generated near the object table 520 and hence near the object to be held by the object table 520 where the electrons are to be irradiated. The magnetic shield 540 may be formed by a magnetically shielding material, such as a mu-metal and may for example be formed by a foil, sheet, plate, etc.

As a result of the magnetic shield 540, on the one hand, magnetic stray fields may be shielded from the e-beam. On the other hand, moving parts of magnetic material, such as moving magnets of the positioning device or moving local shields, may be shielded and refrained to affect the e-beam.

As depicted in FIG. 5, the magnetic shield 540 is arranged between the positioning device 510 and the electron optics system 500, thus enabling to shield a magnetic stray field from the positioning device 510. As depicted in FIG. 5, the magnetic shield 540 is connected to a part to be moved by the positioning device 510. Accordingly, the magnetic shield 540 may also be identified as a movable magnetic shield or a global movable magnetic shield. Thus, the magnetic shield 540 may be moved as the positioning device 510 is actuated. For example, the part to be moved by the positioning device 510 is the object table 520, enabling the magnetic shield 540 to be moved with the object table 520. Hence, it may be provided that shielding of the actuators of the positioning device 510 is maintained, even if the positioning device 510 moves the object table 520 to a different position.

The magnetic shield 540 may extend below the object table 520, e.g., may extend at a side of the object table 520 that faces away from the electron optics system 500. Hence, the magnetic shield 540 does not require any through hole in the shield for the e-beam to pass through the shield, enabling to provide a high level of shielding.

Using the long stroke stage 511 and short stroke 512 stage as described above, it is possible to connect the magnetic shield 540 to the long stroke stage 511 so as to be moved by the long stroke stage 511. In the long stroke/short stroke configuration, the long stroke stage 511 provides for a coarse positioning and the short stroke stage 512 provides for a fine positioning, i.e. a high precision positioning. The long stroke stage (i.e. long stroke actuator 513) acts between a frame of the positioning device or a balance mass on the one hand and the short stroke stage 512 on the other hand. A movable part of the long stroke stage 511 is connected to the short stroke stage 512 so as to move the short stroke stage 512. The magnetic shield 540 may for example be connected to the movable part of the long stroke stage 511. Moving the magnetic shield 540 by the long stroke stage 511 may provide that the magnetic shield 540 largely follows a movement of the object table 520, by following long stroke stage movements, while the smaller, more accurate movements by the short stroke stage 512 are not followed, thus preventing additional load by the magnetic shield 540 on the short stroke actuator to prevent to adversely affect accuracy or speed of the short stroke positioning, i.e. fine positioning of the object table 520.

In order for the object table 520 to be connected to the positioning device 510, the object table 520 is mounted to the positioning device 510 by means of connecting structures 521 extending through through holes 541 in the magnetic shield 540. In the example described above where the magnetic shield 540 is connected to the movable part of the long stroke stage 511, the connecting structures 521 may extend between the object table 520 and the short stroke stage 512. The movable magnetic shield may be arranged between the long stroke stage 511 and short stroke stage 512 on the one hand and the object table 520 and the electron optics system 500 on the other hand, thus shielding the propagation path of the e-beam from stray fields of the long stroke actuators 513 and short stroke actuators. Thus, a part of the short stroke stage 512 that is moved by the short stroke stage actuator as well as the object table 520 may be arranged at a side of the electron optics system 500

Figure 8:
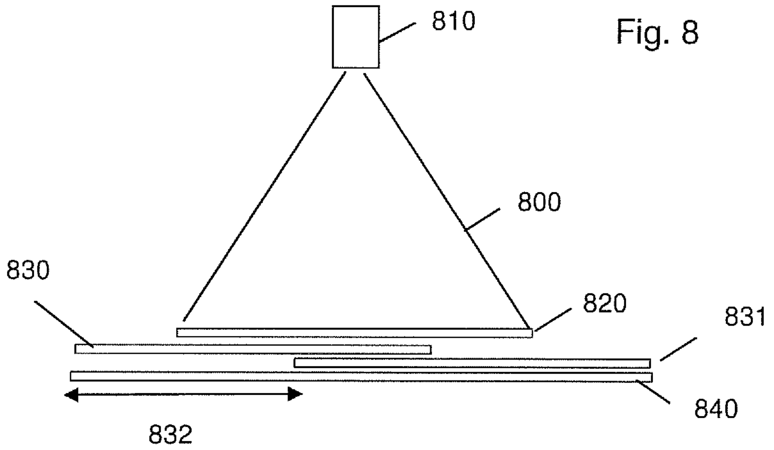
FIG. 8 schematically depicts an exemplary field of view of an electron optics system of an e-beam apparatus according to embodiments of the present disclosure.

As depicted in FIG. 8, the magnetic shield may extend along a field of view 800 of the magnetic lens 810 of the electron optics system 500. The field of view of the electron optics system 500 may be understood as an area covered by a view angle of the electron optics system 500, the view angle of the electron optics system 500 may be understood as a spatial angle under which the electron optics system 500 shows a sensitivity to a magnetic stray field. The field of view may be understood as an area residing in a plane, the plane being substantially parallel to the surface of the object to be inspected. In view of the above definitions, the field of view of the electron optics system 500 may also be referred to as a "magnetic disturbance field of view", e.g., a field of view in which the electron optics system 500 or the e-beam is susceptible to magnetic stray field disturbance. A minimum length of the magnetic shield, in non-moving state, is depicted by 820, thus covering the field of view 800. A displacement between extreme leftmost position 830 and rightmost positions 831 is indicated by 832, thus forming a maximum movement length of the movement of the object table 520. In the embodiments whereby the magnetic shield moves with the positioning device, a length of the magnetic shield extends along at least the field of view 800 of the electron optics system 500, as symbolically indicated by 820 and a (maximum) range of movement of the positioning device as indicated by 832. A shield length of shield 840 forms an addition of the lengths of 820 and 832 hence provides a shield that is able to cover the field of view as the object table 520 and the shield move with a movement having the movement length 832.

Hence, the magnetic shield extends along the field of view of the electron optics system 500, i.e. the field of view for disturbances from stray magnetic fields. Furthermore, as the magnetic shield moves with the positioning device 510, a maximum movement length of the positioning device 510 is taken into account. Hence, at each position of the object table 520 within the (maximum) movement length, the field of view of the electron optics system 500 is faced with the magnetic shield. It will be understood that the term length may be applied to the x direction as well as to the y direction. Thus, the length may be understood is x direction or in y direction. For the sake of completeness, it is noted that the x and y direction may be understood as directions spanning a plane substantially parallel to a surface of the object to be inspected, while the z-direction may be understood as a direction perpendicular to the plane spanned by the x and y directions.

Figure 6:
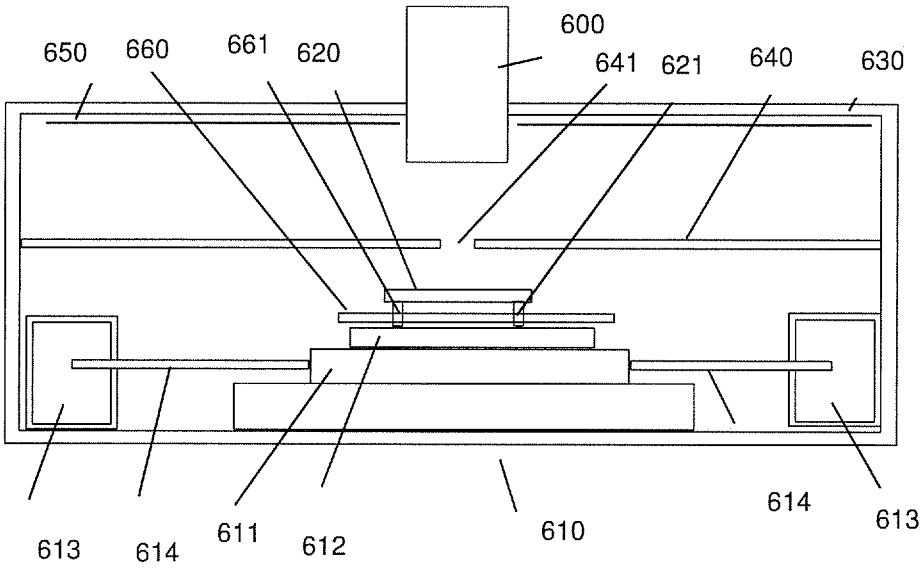
FIG. 6 schematically depicts an exemplary e-beam apparatus according to embodiments of the present disclosure.

FIG. 6 depicts another example, which, likewise to the example depicted in FIG. 5, schematically depicts an e-beam apparatus, such as an e-beam inspection tool, comprising an electron optics system 600, a positioning device 610 and an object table 620. The positioning device 610 and the object table 620 are arranged in a vacuum chamber 630. In the embodiment as depicted in FIG. 6, a magnetic shield 640 is static relative to the electron optics system 600. Accordingly, the magnetic shield 640 may be identified as a static magnetic shield or a global static magnetic shield. The static magnetic shield may for example be mounted to the vacuum chamber 630, to high voltage plates 650 in the vacuum chamber 630, or to the electron optics system 600. As the magnetic shield 640 is stationary, any additional load on the positioning device 610 may be prevented. Furthermore, as the static magnetic shield 640 does not need to be moved by the positioning device 610, a correspondingly low weight of the magnetic shield 640 may not be required. Hence, the static magnetic shield may have a relatively high thickness (or multi layer), and hence may provide a high level of shielding. In order for the propagation path of the e-beam to pass, the static magnetic shield 640 is provided with a through hole 641, whereby the propagation path of the e-beam passes through the through hole.

FIG. 6 further depicts an exemplary movable magnetic shield 660. The movable magnetic shield 660 faces the through hole in the static magnetic shield 640, thus providing that the movable magnetic shield 660 shields the electron optics system 600 and the e-beam along the propagation path from any remaining stray fields that could otherwise pass through the through hole in the static magnetic shield 640. The movable magnetic shield 660 is arranged between the positioning device 610 and the object table 620 thus to at least partly shield the electron optics system 600 from (one or more actuators of) the positioning device 610. Furthermore, the movable magnetic shield 660 extends at a side of the object table 620 that faces away from the electron optics system 600 thus to prevent the movable magnetic shield 660 to obstruct the propagation path of the e-beam.

The movable magnetic shield 660 is connected to the positioning device 610 to be moved by the positioning device 610, thus to provide that the movable magnetic shield 660 may be held in proximity of the static magnetic shield 640, in particular in proximity of the through hole in the static magnetic shield 640. The object table 620 is mounted to the positioning device 610 by means of connecting structures 621 extending through through holes 661 in the movable magnetic shield 660, thus providing that the movable magnetic shield 660 shields the actuators of the positioning device as the actuators of the positioning device are arranged below the movable magnetic shield 660 while the object table 620 is arranged above the movable magnetic shield 660. Similarly as described with reference to the long stroke stage 611—short stroke stage 612 arrangement of FIG. 5, the movable magnetic shield 660 may be connected to the long stroke stage 611 to be moved by the long stroke stage of the long stroke stage 611—short stroke stage 612 arrangement in FIG. 6, thus to position the movable magnetic shield 660 to follow a coarse movement of the object table 620, without providing a load by the shield onto the possibly more accurate, more fast short stroke stage 612. The movable magnetic shield 660 may be arranged between the long stroke actuator 613 and short stroke actuator on the one hand and the object table 620 and the electron optics system 600 on the other hand, thus shielding the propagation path of the e-beam from stray fields of the long stroke and short stroke actuators.

Reverting again to FIG. 8, a length of the static magnetic shield 640 extends along at least a field of view 800 of the electron optics system 600, hence at least having a length of the shield 820 in FIG. 8. Thus, the magnetic shield extends along the field of view of the electron optics system 600, i.e. the field of view for disturbances from stray magnetic fields. It will be understood that the term length may be applied to the x direction as well as to the y direction. Thus, the length may be understood is x direction or in y direction.

Figure 7A:
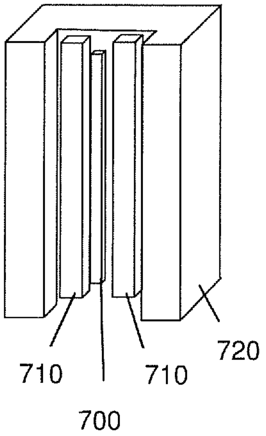
FIGS. 7A and 7B schematically depicts an exemplary actuator of an e-beam apparatus according to embodiments of the present disclosure.
Figure 7B:
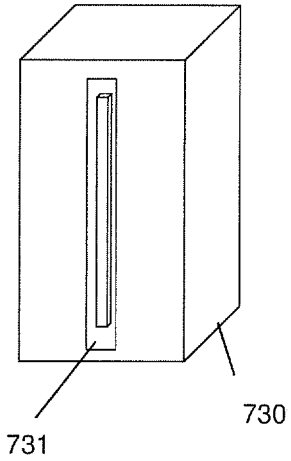

In the example of FIG. 5 as well as the embodiment of FIG. 6, a local magnetic shield of at least one of the stages is provided. As depicted in FIG. 7A, actuators of the stages of the positioning device 510, 610 may comprise a coil part 700 (such as a motor coil), a magnet part 710 (such as a permanent magnet or an electromagnet), and a back-iron part 720. As depicted in FIG. 7B, the coil part and the magnet part of the at least one of the stages is substantially enveloped by a magnetically shielding material 730. An opening 731 may be provided in the enveloping, for example a slit in the shield of the short stroke actuator as depicted in FIG. 7B so as to provide connections to the outside of the local magnetic shield such as electric cables, cooling channels. The opening can also be a hole or holes through which connections, between a part of the stage and an object outside the local magnetic shield, passes or moves. By the enveloping, stray fields from the stage are locally shielded to a large extent thus providing a further reduction in stray fields. Such shielding is for example depicted in FIGS. 5 and 6, where long stroke stage actuators 513, 613 are partially enveloped accordingly.

Furthermore, both in the example of FIG. 5 as well as the example of FIG. 6, a long stroke stage 511, 611—short stroke stage 512, 612 arrangement is applied. The positioning device 510, 610 comprises the short stroke stage 512, 612 to position the object table 520, 620 and the long stroke stage 511, 611 to position the short stroke stage 512, 612 and the object table 520, 620. The long stroke stage 511, 611 will generally be a higher power stage as compared to the short stroke stage 512, 612. Accordingly, a magnitude of a stray field by the long stroke stage 511, 611 may exceed a magnitude of a stray field by the short stroke stage 512, 612. In order to further reduce n effect of stray fields, the long stroke stage 511, 611 is arranged at a relatively large distance from the object table 520, 620. Accordingly, the long stroke stage 511, 611 comprises dual long stroke stage actuators 513, 613, the dual long stroke stage actuators 513, 613 being arranged spaced apart on either side of the short stroke stage 512, 612. The long stroke stage actuators 513, 613 are spaced apart seen in a direction parallel to a surface of the object that is to be inspected, i.e. in a direction parallel to a main plane of movement of the positioning device 510, 610, i.e. in the present example in a horizontal direction. The positioning device 510, 610 further comprises connecting structures 514, 614 connecting long stroke stage actuators 513, 613 to the long stroke carrier 511, 611 which holds the short stroke 512, 612. The connecting structures 514, 614 extend in the direction parallel to the main plane of movement of the positioning device 510, 610.

As explained above the static or movable magnetic shield may be provided with at least one through hole 541, 661, 641 e.g. for allowing the propagation path of the e-beam to pass or for allowing a connecting structure that connects the object table to the stage to pass. In order to keep an effect of stray fields through the through hole low, a distance of the magnetic shield to a magnetic lens of the electron optics system 500, 600 along the optical axis of the electron optics system 500, 600 may be at least 5 times larger than a diameter of the through hole. A diameter of the through hole of $1/10^{th}$ or less of the distance of the magnetic shield to the magnetic lens of the electron optics system 500, 600 may further reduce an effect of stray fields through the through hole.

A further effect of the magnetic shielding may be to provide for thermal shielding. Accordingly, at least one of the magnetic shield and the local magnetic shield may further act as a thermal shield.

A further effect of the magnetic shielding may be to provide a barrier for particles, thereby e.g. forming a barrier for contamination. Accordingly, at least one of the magnetic shield and the local magnetic shield further acts as a particle barrier.

The e-beam inspection tool may comprise s high voltage plate, such as a stationary high voltage plate connected to the vacuum chamber such as the plates 650 in FIG. 6, or a high voltage plate provided in the positioning device 610. In order to reduce an additional volume that would be required for the magnetic shield, the magnetic shield may be combined with the high voltage plate of the e-beam inspection tool. The high voltage plate and the magnetic shield may form separate layers connected to each other, whereby each layer provides its intended function. Alternatively, the high voltage plate and the magnetic shielding may be integrated, for example by providing high voltage plate using a mu-metal or similar type of material.

In addition to the magnetic shielding as explained above, or as an alternative to reduce an effect of magnetic stray fields, the e-beam inspection tool may comprise a non-magnetic gravity compensator such as a mechanical gravity compensator or a pneumatic gravity compensator, or a magnetic gravity compensator with a magnetic shield. The e-beam inspection tool may make use of a gravity compensator to exert a vertical force, e.g. onto the object table or a part of the positioning device, to compensate for a gravity force. For example, when making use of the short stroke stage and long stroke stage as described elsewhere in the present document, a gravity force on the short stroke stage may be at least partly compensated to enable, a fast, accurate positioning or to reduce an actuator dissipation as lower actuator power may be required. Thereby, the gravity compensator may for example act on the movable part of the short stroke actuator. The gravity compensator at least partly compensates for gravity force, e.g. on a mass of the short stroke stage (possibly including the object table and the object), thereby reducing a static force to be actuated by the short stroke stage, hence enabling to reduce actuator dissipation of the short stroke stage. By applying a mechanical gravity compensator instead of e.g. magnetic gravity compensation, stray fields may be reduced.

Figure 9:
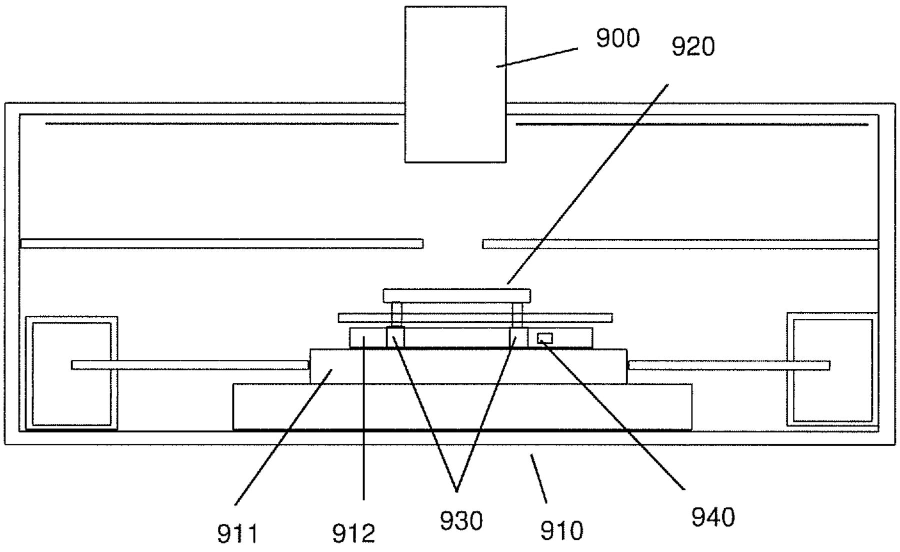
FIG. 9 schematically depicts an exemplary e-beam apparatus according to embodiments of the present disclosure.

FIG. 9 depicts an electron optics system 900, a positioning device 910 to position the object held by the object table 920 relative to the electron optics system 900, an object table 920 to hold the object. The positioning device 910 comprises the short stroke stage 912 to position the object table 920 and the long stroke stage 911 to position the short stroke stage 912 and the object table 920. A mechanical gravity compensator 930 is provided. The mechanical gravity compensator 930 may comprise a spring, such as one of more coil springs. The coil springs may be provided with an equal number of windings in opposite directions, e.g., in clockwise and in counter clockwise directions to at least reduce spring torsion under suppression of the spring, thus to avoid a disturbance force by torsion onto the positioning device 910, which could influence a positioning accuracy of the positioning device 910. Alternatively, other non-magnetic gravity compensators may be provided, such as a pneumatic gravity compensator or a shielded magnetic gravity compensator.

In case the positioning device 910 comprises the short stroke stage 912 to position the object table and the long stroke stage 911 to position the short stroke stage 912 and the object table 920, the gravity compensator 930 may be comprised in, e.g. integrated in, the short stroke stage 912, thus to provide a compact configuration whereby the gravity compensator 930 acts on the mass to be compensated with a short force path.

In addition to the magnetic shielding as explained above, or as an alternative to reduce an effect of magnetic stray fields, the e-beam inspection tool may comprise a position sensor 940, the position sensor 940 being a non-magnetic position sensor such as an optical position sensor or a strain gauge position sensor, to measure the relative distance between the short stroke stage 912 and the object table 920, or between the short stroke stage 912 and the long stroke stage 911. Accordingly stray magnetic fields as a result of a magnetic position sensor may be prevented. In some embodiments, the position sensor 940 may be formed by a magnetic position sensor that is shielded by a magnetic shield.

Further embodiments may be described in the following clauses:

1. An e-beam apparatus comprising:
   an electron optics system configured to project an e-beam onto an object,
   an object table to hold the object,
   a positioning device configured to move the object table relative to the electron optics system,
   wherein the e-beam apparatus further comprises a magnetic shield to shield the electron optics system from a magnetic disturbance generated by the positioning device.
2. The e-beam apparatus according to clause 1, the positioning device comprising a short stroke stage configured to move the object table relative to the electron optics system and a long stroke stage configured to move the short stroke stage relative to the electron optics system.
3. The e-beam apparatus according to clause 1 or 2, wherein the positioning device further comprises a magnetic actuator.
4. The e-beam apparatus according to clause 3, wherein the magnetic actuator is configured to move the object table.
5. The e-beam apparatus according to any preceding clauses, wherein the magnetic shield is arranged between the positioning device and the electron optics system.
6. The e-beam apparatus according to any preceding clauses, wherein the magnetic shield comprises a movable magnetic shield which is connected to a part to be moved by the positioning device.
7. The e-beam apparatus according to any of the preceding clauses, wherein the movable magnetic shield is arranged at a side of the object table that faces away from the electron optics system.
8. The e-beam apparatus according to clause 6 or 7, wherein the movable magnetic shield is connected to the long stroke stage or a part to be moved by the long stroke stage.
9. The e-beam apparatus according to any of clause 6 to 8 comprising the magnetic actuator, wherein the movable magnetic shield is configured to at least partially shield a magnetic disturbance generated by the magnetic actuator.
10. The e-beam apparatus according to any of clauses 6-9, wherein the object table is mounted to the positioning device by connecting structures extending through through holes in the movable magnetic shield.
11. The e-beam apparatus according to any of clauses 6 to 10, wherein a length of the movable magnetic shield extends along at least a field of view of the electron optics system and a range of movement of the positioning device.
12. The e-beam apparatus according to clause 1, wherein the magnetic shield comprises a static magnetic shield which is static relative to the electron optics system.

13. The e-beam apparatus according to clause 12, wherein a length of the static magnetic shield extends along at least a field of view of the electron optics system.
14. The e-beam apparatus according to clause 12 or 13, wherein the static magnetic shield is provided with a through hole, a propagation path of the e-beam passing through the through hole.
15. The e-beam apparatus according to any of clauses 12 to 14, wherein the magnetic shield comprises a further magnetic shield.
16. The e-beam apparatus according to clause 15, wherein the further magnetic shield faces the through hole in the static magnetic shield.
17. The e-beam apparatus according to clause 15 or 16, wherein the further magnetic shield is the movable magnetic shield according to any of clauses 5 to 11.
18. The e-beam apparatus according to any of the preceding clauses, wherein the magnetic shield comprises a local magnetic shield configured to substantially envelop the magnetic actuator by a magnetically shielding material.
19. The e-beam apparatus according to clause 18, wherein an opening is provided in the local magnetic shield.
20. The e-beam apparatus according to any of the preceding clauses, wherein the magnetic shield is provided with a through hole, a distance of the through hole to a magnetic lens of the electron optics system being at least 5 times larger than a diameter of the through hole.
21. The e-beam apparatus according to any of the preceding clauses, wherein the magnetic shield further acts as a thermal shield.
22. The e-beam apparatus according to any of the preceding clauses, wherein the magnetic shield further acts as a particle barrier.
23. The e-beam apparatus according to any of the preceding clauses, wherein the e-beam apparatus comprises a high voltage plate, and wherein the magnetic shield is combined with the high voltage plate.
24. The e-beam apparatus according to clause 23, wherein the high voltage plate and the magnetic shield may form separate layers connected to each other.
25. The e-beam apparatus according to any of clauses 1 to 23, wherein the high voltage plate comprises a magnetic shielding material for integrating a magnetic shielding functionality into the high voltage plate.
26. An e-beam apparatus preferably according to any of the preceding clauses, comprising:

an electron optics system configured to project an e-beam onto an object, an object table to hold the object, a positioning device configured to move the object table relative to the electron optics system, wherein the positioning device comprises a short stroke stage to move the object table relative to the electron optics system and a long stroke stage to move the short stroke stage relative to the electron optics system, wherein the long stroke stage comprises dual long stroke, stage actuators, the dual long stroke stage actuators being arranged, seen in a direction parallel to a main plane of movement of the positioning device, spaced apart on either side of the short stroke stage, the positioning device further comprising connecting structures connecting the short stroke stage to the respective long stroke stage actuators, the connecting structures extending in the direction parallel to the main plane of movement of the positioning device.

27. An e-beam apparatus according to any of the preceding clauses further comprising a gravity compensator to at least partly compensate a gravity force on at least one of the object table and a part of the positioning device, the gravity compensator being a non-magnetic gravity compensator or a magnetic gravity compensator shielded by a magnetic shield.
28. An e-beam apparatus comprising:

an electron optics system configured to project an e-beam onto an object, an object table to hold the object, a positioning device configured to move the object table relative to the electron optics system, wherein the e-beam apparatus further comprises a gravity compensator to at least partly compensate a gravity force on at least one of the object table and a part of the positioning device, the gravity compensator being a non-magnetic gravity compensator or a magnetic gravity compensator shielded by a magnetic shield.

29. The e-beam apparatus according to clause 27 or 28, wherein the non-magnetic gravity compensator is a mechanical gravity compensator which comprises a spring.
30. The e-beam apparatus according to clause 29, wherein the spring comprises a coil spring having an equal number of windings in opposite directions.
31. The e-beam apparatus according to any of clauses 27 to 30, wherein the positioning device comprises a short stroke stage to position the object table and a long stroke stage to position the short stroke stage and the object table, and wherein the gravity compensator is comprised in the short stroke stage.
32. An e-beam apparatus according to any of the preceding clauses, the positioning device comprising the short stroke stage to position the object table and the long stroke stage to position the short stroke stage and the object table, wherein the e-beam apparatus further comprises a position sensor to measure a relative distance between the short stroke stage and the long stroke stage, or between the short stroke stage and the object table, the position sensor being a non-magnetic position sensor or a magnetic position sensor shielded by a magnetic shield.

33. An e-beam apparatus comprising:

an electron optics system configured to project an e-beam onto an object, an object table to hold the object, a positioning device configured to move the object table relative to the electron optics system, wherein the positioning device comprises a short stroke stage to position the object table and a long stroke stage to position the short stroke stage and the object table, wherein the e-beam apparatus further comprises a position sensor to measure a relative distance between the short stroke stage and the long stroke stage, or between the short stroke stage and the object table, the position sensor being a non-magnetic position sensor or a magnetic position sensor shielded by a magnetic shield.

34. An e-beam apparatus according to any of the preceding clauses, wherein the e-beam apparatus is a scanning electron microscope, an electron beam direct writer, an electron beam projection lithography apparatus, an electron beam inspection apparatus, an electron beam defect verification apparatus, or an electron beam metrology apparatus.

As used herein, unless specifically stated otherwise, the term "or" encompasses all possible combinations, except where infeasible. For example, if it is stated that a component may include A or B, then, unless specifically stated otherwise or infeasible, the component may include A, or B, or A and B. As a second example, if it is stated that a component may include A, B, or C, then, unless specifically stated otherwise or infeasible, the component may include A, or B, or C, or A and B, or A and C, or B and C, or A and B and C.

Although specific reference may be made in this text to embodiments of the present disclosure in the context of an inspection apparatus, the object table may be suitable for use in: an electron beam apparatus, a scanning electron microscope, an electron beam direct writer, an electron beam projection lithography apparatus, an electron beam inspection apparatus, an electron beam defect verification apparatus, or an electron beam metrology apparatus.

Although the present disclosure has been explained in relation to its preferred embodiments, it is to be understood that other modifications and variation can be made without departing the spirit and scope of the disclosed subject matter as hereafter claimed.

What is claimed is:

1. An e-beam apparatus comprising:

an electron optics system configured to project an e-beam onto an object, an object table to hold the object, a positioning device configured to move the object table relative to the electron optics system, the positioning device comprising a short stroke stage configured to move the object table relative to the electron optics system and a long stroke stage configured to move the short stroke stage relative to the electron optics system, and a first magnetic shield to shield the electron optics system from a magnetic disturbance generated by the positioning device, the first magnetic shield having a plurality of through holes, wherein the object table is mounted to the positioning device by a plurality of connecting structures extending through the plurality of through holes of the first magnetic shield.

2. The e-beam apparatus according to claim 1, wherein the positioning device further comprises a magnetic actuator.

3. The e-beam apparatus according to claim 2, wherein the magnetic actuator is configured to move the object table.

4. The e-beam apparatus according to claim 2, further comprising a third magnetic shield comprising a local magnetic shield configured to substantially envelop the magnetic actuator by a magnetically shielding material.

5. The e-beam apparatus according to claim 4, wherein the first magnetic shield further comprises a movable magnetic shield which is connected to a part to be moved by the positioning device.

6. The e-beam apparatus according to claim 4, wherein an opening is provided in the local magnetic shield.

7. The e-beam apparatus according to claim 1, wherein the first magnetic shield comprises a movable magnetic shield which is connected to a part to be moved by the positioning device.

8. The e-beam apparatus according to claim 7, wherein the movable magnetic shield is connected to the long stroke stage or a part to be moved by the long stroke stage.

9. The e-beam apparatus according to claim 7, comprising the magnetic actuator, wherein the movable magnetic shield is configured to at least partially shield a magnetic disturbance generated by the magnetic actuator.

10. The e-beam apparatus according to claim 7, wherein a length of the movable magnetic shield extends along at least a field of view of the electron optics system and a range of movement of the positioning device.

11. The e-beam apparatus according to claim 1, further comprising a second magnetic shield comprising a static magnetic shield that is static relative to the electron optics system.

12. The e-beam apparatus according to claim 11, wherein a length of the static magnetic shield extends along at least a field of view of the electron optics system.

13. The e-beam apparatus according to claim 11, wherein the static magnetic shield is provided with a through hole, a propagation path of the e-beam passing through the through hole.

14. The e-beam apparatus according to claim 11, wherein the first magnetic shield comprises a movable magnetic shield which is connected to a part to be moved by the positioning device.

15. The e-beam apparatus according to claim 1, wherein the first magnetic shield further acts as a thermal shield or acts as a particle barrier.

16. The e-beam apparatus according to claim 1, wherein the e-beam apparatus comprises a high voltage plate, and wherein the first magnetic shield is combined with the high voltage plate.

17. The e-beam apparatus according to claim 1, further comprising a gravity compensator to at least partly compensate a gravity force on at least one of the object table and a part of the positioning device, the gravity compensator being a non-magnetic gravity compensator or a magnetic gravity compensator shielded by the first magnetic shield.

18. The e-beam apparatus according to claim 1, further comprising a position sensor to measure a relative distance between the short stroke stage and the long stroke stage, or between the short stroke stage and the object table, the position sensor being a non-magnetic position sensor or a magnetic position sensor shielded by the first magnetic shield.

19. The e-beam apparatus according to claim 1, wherein the e-beam apparatus is a scanning electron microscope, an electron beam direct writer, an electron beam projection lithography apparatus, an electron beam inspection apparatus, an electron beam defect verification apparatus, or an electron beam metrology apparatus.

20. An e-beam apparatus comprising:

an electron optics system configured to project an e-beam onto an object;

an object table to hold the object;

a positioning device configured to move the object table relative to the electron optics system, the positioning device comprising:

a short stroke stage configured to move the object table relative to the electron optics system, and a long stroke stage configured to move the short stroke stage relative to the electron optics system;

a movable magnetic shield connected to a part to be moved by the positioning device and having a plurality of through holes, wherein the object table is mounted to the positioning device by a plurality of connecting structures extending through a plurality of through holes in the movable magnetic shield; and a static magnetic shield that is static relative to the electron optics system, wherein the static magnetic shield is provided with a hole, a propagation path of the e-beam passing through the hole.

* * * * *